(12) United States Patent
Benefield

(10) Patent No.: US 6,585,925 B2
(45) Date of Patent: Jul. 1, 2003

(54) PROCESS FOR FORMING MOLDED HEAT DISSIPATION DEVICES

(75) Inventor: Joseph A. Benefield, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/750,411

(22) Filed: Dec. 27, 2000

(65) Prior Publication Data

US 2002/0079613 A1 Jun. 27, 2002

(51) Int. Cl.⁷ .................. B29C 45/14; B29C 45/16
(52) U.S. Cl. ............. 264/255; 264/272.17; 264/328.7; 264/328.8; 264/328.18
(58) Field of Search ............... 264/250, 255, 264/328.8, 272.11, 272.14, 272.17, 328.18, 104, 105, 254, 271.1, 272.15, 328.7

(56) References Cited

U.S. PATENT DOCUMENTS

| | | | |
|---|---|---|---|
| 4,585,686 A | | 4/1986 | Hasegawa et al. |
| 5,215,140 A | * | 6/1993 | Beane .................. 164/65 |
| 5,254,500 A | * | 10/1993 | AuYeung ............... 437/214 |
| 5,344,795 A | * | 9/1994 | Hashemi et al. ........ 437/214 |
| 5,424,251 A | | 6/1995 | Sono et al. |
| 5,444,909 A | * | 8/1995 | Mehr ..................... 29/827 |
| 5,709,960 A | | 1/1998 | Mays et al. |
| 5,856,911 A | * | 1/1999 | Riley .................... 361/704 |
| 5,981,085 A | | 11/1999 | Ninomiya et al. |
| 6,008,281 A | | 12/1999 | Yang et al. |
| 6,114,413 A | * | 9/2000 | Kang et al. ............. 523/210 |
| 6,114,761 A | * | 9/2000 | Mertol et al. ........... 257/722 |
| 6,196,821 B1 | * | 3/2001 | Chen .................... 425/125 |
| 6,327,145 B1 | * | 12/2001 | Lin et al. ............... 361/697 |

FOREIGN PATENT DOCUMENTS

JP          07321261          12/1995

* cited by examiner

Primary Examiner—Angela Ortiz
(74) Attorney, Agent, or Firm—Robert G. Winkle

(57) ABSTRACT

Heat dissipation devices and molding processes for fabricating such devices, which have at least two regions comprising different conductive materials such that efficient thermal contact is made between the different conductive materials. The molding processes include injection molding at least two differing conductive materials.

9 Claims, 14 Drawing Sheets

PROCESS FOR FORMING MOLDED HEAT DISSIPATION DEVICES

BACKGROUND OF THE INVENTION

1. Field of the Invention

The present invention relates to heat dissipation devices and methods for fabricating the same. In particular, the present invention relates to a multiple step injection molding technique used to form a heat dissipation device comprising at least two separate conductive material regions.

2. State of the Art

Higher performance, lower cost, increased miniaturization of integrated circuit components, and greater packaging density of integrated circuits are ongoing goals of the computer industry. As these goals are achieved, microelectronic dice become smaller. Accordingly, the density of power consumption of the integrated circuit components in the microelectronic die has increased, which, in turn, increases the average junction temperature of the microelectronic die. If the temperature of the microelectronic die becomes too high, the integrated circuits of the microelectronic die may be damaged or destroyed.

Various apparatus and techniques have been used and are presently being used for removing heat from microelectronic dice. One such heat dissipation technique involves the attachment of a high surface area heat sink to a microelectronic die. FIG. 12 illustrates an assembly 300 comprising a microelectronic die 302 (illustrated as a flip chip) physically and electrically attached to a substrate carrier 304 by a plurality of solder balls 306. A heat sink 308 is attached to a back surface 312 of the microelectronic die 302 by a thermally conductive adhesive 314. The heat generated by the microelectronic die 302 is drawn into the heat sink 308 (following the path of least thermal resistance) by conductive heat transfer.

High surface area heat sinks 308 are generally used because the rate at which heat is dissipated from a heat sink is substantially proportional to the surface area of the heat sink. The high surface area heat sink 308 usually includes a plurality of projections 316 extending substantially perpendicularly from the microelectronic die 302. It is, of course, understood that the projections 316 may include, but are not limited to, elongate planar fin-like structures and columnar/pillar structures. The high surface area of the projections 316 allows heat to be convectively dissipated from the projections 316 into the air surrounding the high surface area heat sink 308. A fan 318 may be incorporated into the assembly 300 to enhance the convective heat dissipation.

The heat sinks 308 may be fabricated by molding, such as injection or extrusion, or by forming the projections 316 from a block of conductive material (such as by skiving) or attaching projections (such as folded fins) to a conductive block. Furthermore, the heat sinks 308 may be constructed from a thermally conductive material, such as copper, silver, gold, aluminum, and alloys thereof. However, although copper, gold, and silver have excellent thermal conductivity (e.g., greater than about 300 J/(s*m*° C.) between about 0° C. and 100° C.), they are heavy (e.g., specific gravities of greater than about 8.0), such that the weight of the heat sink 308 could damage the microelectronic die 302 to which it is attached. Furthermore, they are expensive (prohibitively so with gold and silver) relative to other conductive materials. Thus, less expensive and lighter materials such as aluminum (i.e., a specific gravity of about 2.7) could be used. However, since aluminum and other lighter materials generally have lower thermal conductive properties lower than gold, silver, and copper (less than about 300 J/(s*m*° C.) between about 0° C. and 100° C.), they may not have sufficient thermal conductive properties to adequately cool a high heat producing microelectronic die 302.

Thus, some heat sinks are a combination of highly thermally conductive materials and lightweight, relatively, less thermally conductive material to form multiple conductive material designs. FIG. 13 illustrates such a heat sink 320 comprising a highly thermally conductive plate portion 322 (such as copper) and a lightweight thermally conductive, high surface area portion 324 (such as aluminum) having projections 326 thereon. The plate portion 322 and the high surface area portion 324 are attached to one another by any known connection method. This design allows the highly thermally conductive plate portion 322 to thermally contact the microelectronic die 302 for effective heat removal and to conduct the heat to the lighter, high surface area portion 324 for convective dissipation to the surrounding air.

Another design of a heat sink 330 comprises an extruded, lightweight, high surface area portion 332 having a plurality of projections 334 and a highly conductive plate portion 336 which has been pressed into the high surface area portion 332, as shown in FIG. 14. Both multiple metal designs of FIGS. 13 and 14 result in lightweight heat sinks; however, the interface between the high surface area portions and the plate portions may not have an efficient contact. Surface variations between the high surface area portion and the plate portion may result in very small voids/air spaces, which reduces the efficiency of the thermal contact therebetween.

Therefore, it would be advantageous to develop techniques to fabricate a multiple material heat sink that has efficient thermal contact between the various materials in the heat sink.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENTS

Figure 1:
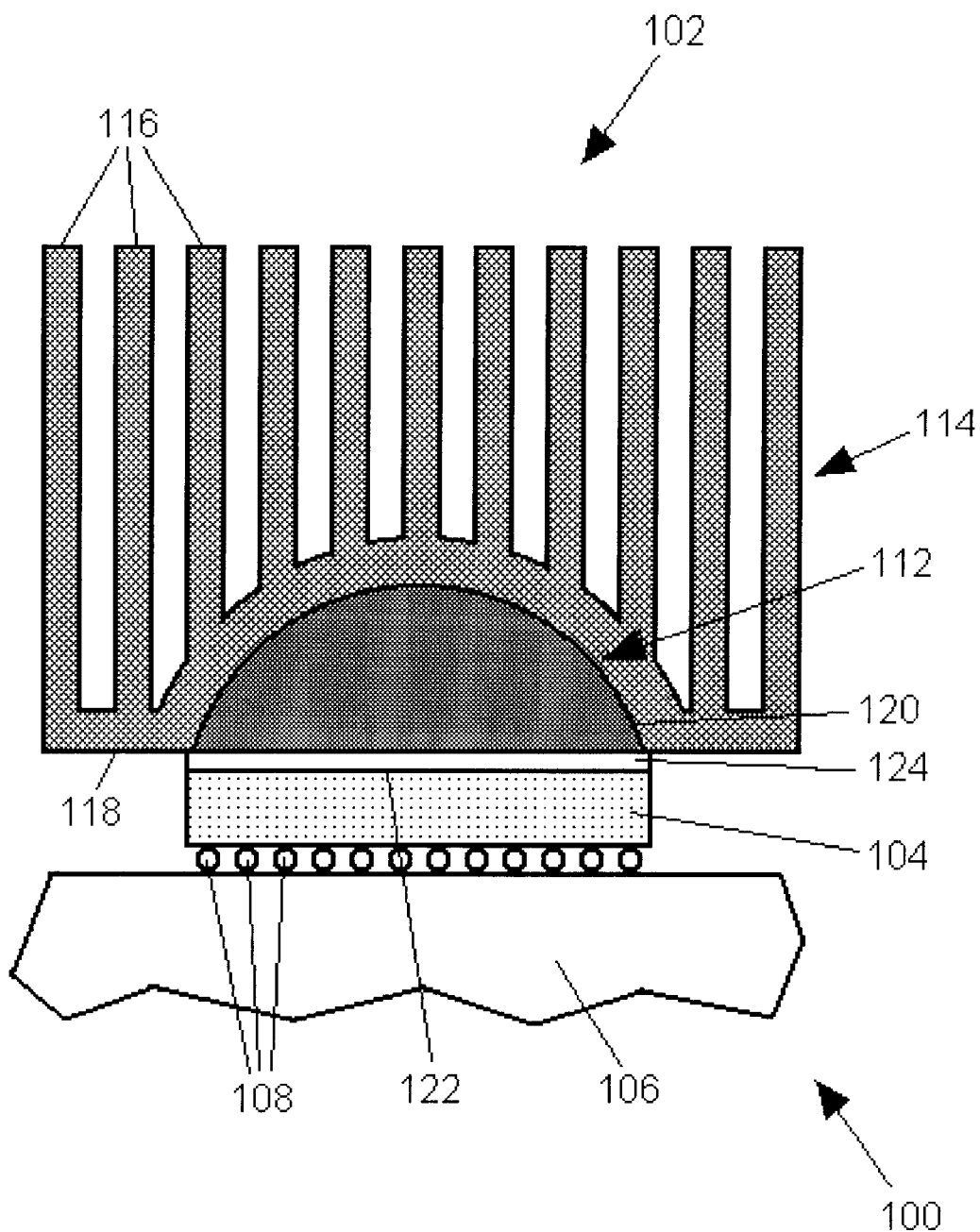
FIG. 1 is a side cross-sectional view of a first embodiment of a heat dissipation device attached to a microelectronic die, according to the present invention.

In the following detailed description, reference is made to the accompanying drawings that show, by way of illustration, specific embodiments in which the invention may be practiced. These embodiments are described in sufficient detail to enable those skilled in the art to practice the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a process for fabricating a heat dissipation device, which has at least two regions comprising different conductive materials wherein an efficient thermal contact is made between the different conductive materials. Broadly, the present invention relates to a molding process, such a two-shot molding process known in the plastics industry, wherein the heat dissipation device is molded with at least two injections of differing thermally conductive materials.

FIG. 1 illustrates a microelectronic assembly 100 of the present invention comprising a heat dissipation device 102 attached to a microelectronic die 104 (illustrated as a flip chip). The microelectronic die 104 is physically and electrically attached to a substrate 106 by a plurality of solder balls 108. The heat dissipation device 102 comprises a highly thermally conductive portion 112 (e.g., thermal conductivity higher than about 300 J/(s*m*° C.) between about 0° C. and 100° C.), such as copper (e.g., approximate thermal conductivity of 397 J/(s*m*° C.) between about 0° C. and 100° C.) and a second thermally conductive portion, shown as finned portion 114 having a plurality of projections 116, comprising a lightweight weight conductive material, such as aluminum (e.g., approximate thermal conductivity of 238 J/(s*m*° C.) between about 0° C. and 100° C.). The heat dissipation device 102 further includes a molded interface 120 between the highly thermally conductive portion 112 and the second thermally conductive portion (shown as finned portion 114).

It is, of course, understood that the projections 116 may include, but are not limited to, elongate planar fin-like structures (extending perpendicular to the figure) and columnar/pillar structures. Preferably, the projections 116 extend substantially perpendicularly to a substantially planar mounting surface 118 of the heat dissipation device 102.

As shown in FIG. 1, the heat dissipation device mounting surface 118 is attached to a back surface 122 of the microelectronic die 102, preferably by a thermally conductive adhesive 124. Although the heat dissipation device 102 is illustrated as being attached to the microelectronic die 104, the invention is, of course, not so limited. The heat dissipation device 102 may be attached to any surface from which heat is desired to be dissipated. Preferably, the highly thermally conductive portion 112 resides adjacent the heat source. It is also preferred that the highly thermally conductive portion 112 comprises a portion of said heat dissipation device mounting surface 118.

Figure 2:
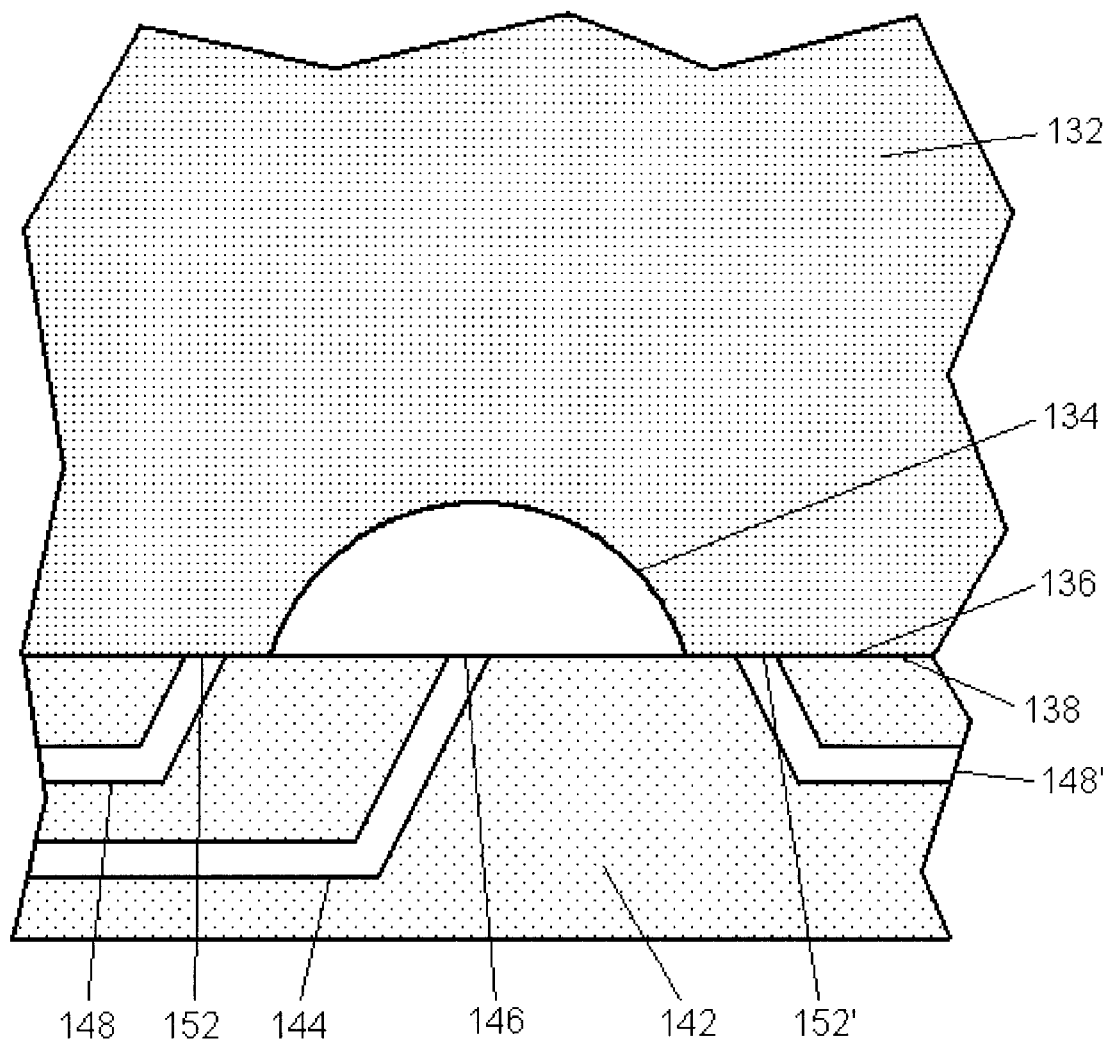
FIG. 2 is a side cross-sectional view of a mold core with a first mold having a cavity defined therein abutted against the mold core, according to the present invention.

FIGS. 2–7 illustrate one embodiment of a method of fabricating a heat dissipation device. As shown in FIG. 2, a first mold 132 having a contact surface 136 and a cavity 134 defined therein is provided. The first mold contact surface 136 is placed against a contact surface 138 of a mold core 142. The mold core 142 has at least one first "channel" or "gate" 144 extending through the mold core 142, wherein the first gate 144 has at least one opening (shown as a single opening 146) at the mold core contact surface 138. The first gate opening 146 is positioned at the first mold cavity 134 when the first mold 132 and the mold core 142 are placed together. It is noted that the mold core 142, as shown, has at least one second gate (shown as two second gates 148 and 148') which will be utilized in subsequent steps, but whose opening(s) (shown as openings 152 and 152', respectively) are presently blocked by the first mold contact surface 136.

Figure 3:
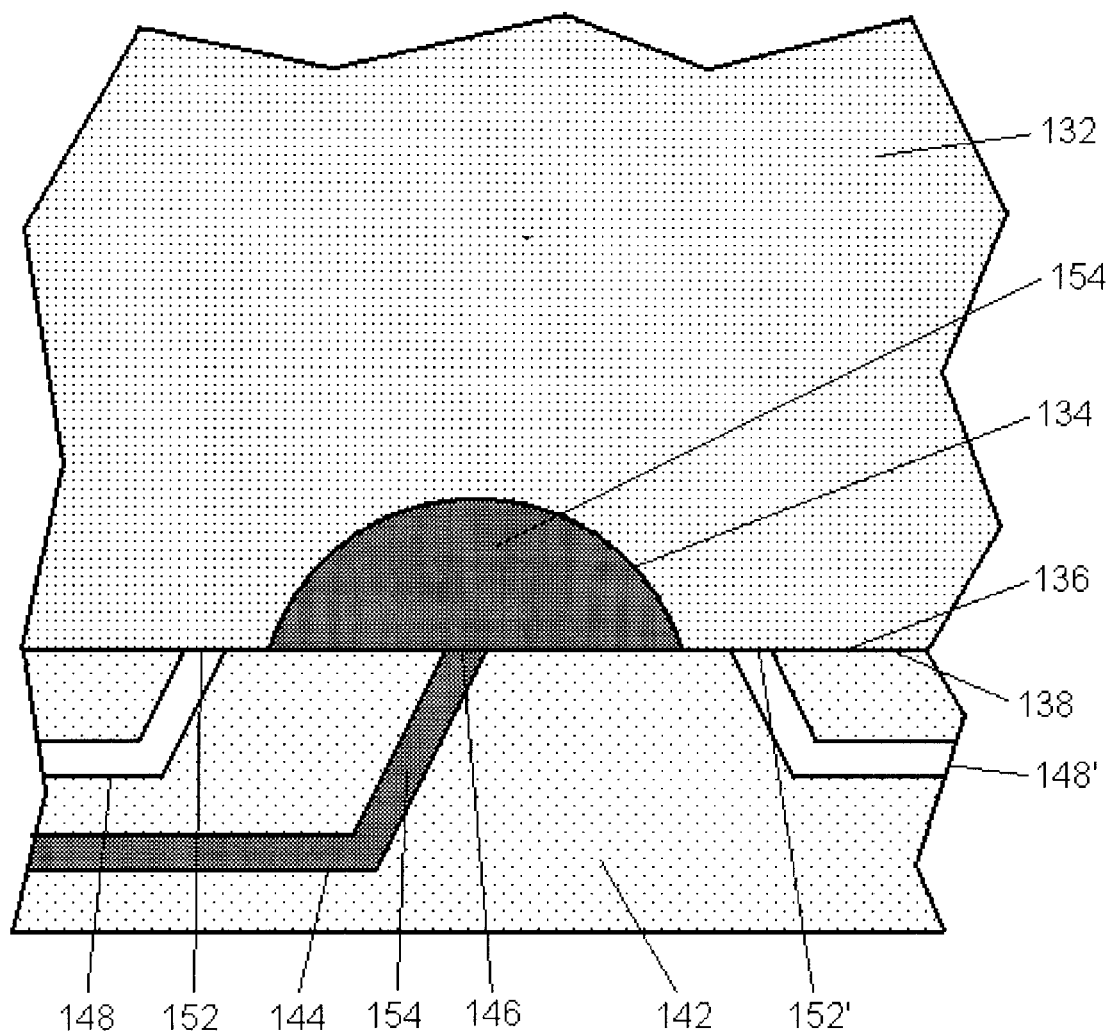
FIG. 3 is a side cross-sectional view of a first conductive material injected into the first mold cavity of FIG. 2, according to the present invention.
Figure 4:
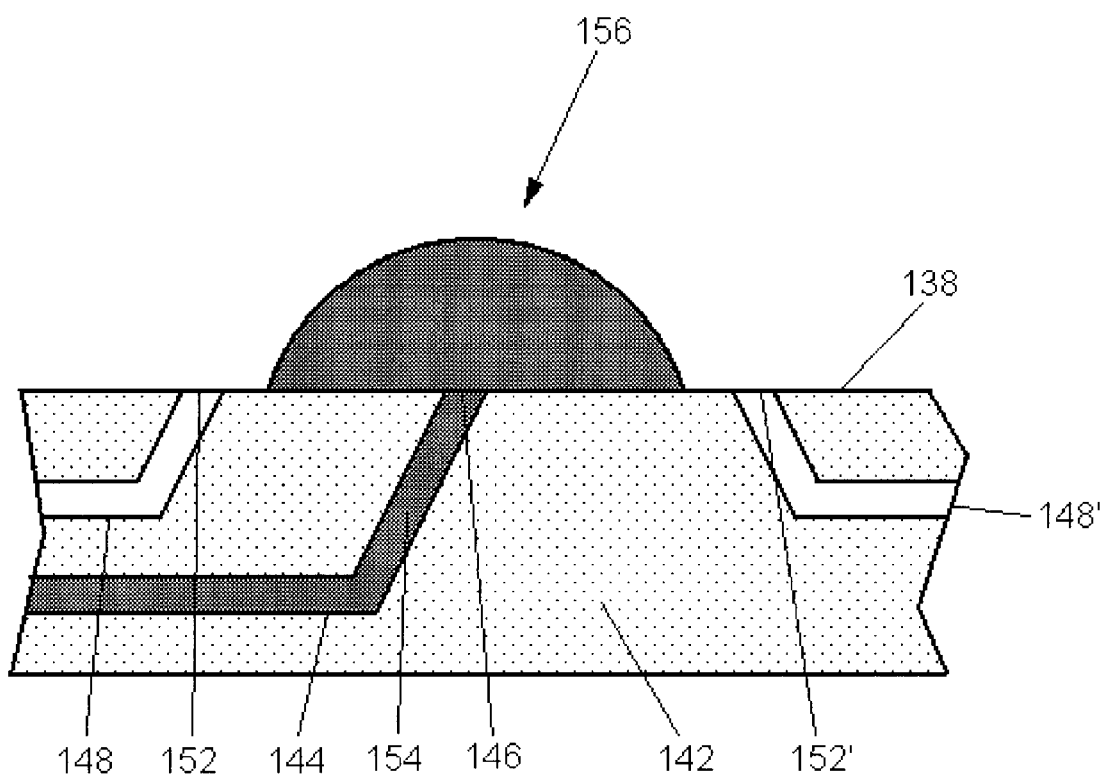
FIG. 4 is a side cross-sectional view of the first mold of FIG. 3 removed from the mold core, according to the present invention.

As shown in FIG. 3, a high thermal conductivity material 154 is injected through the first gate 144 to fill the first mold cavity 134 (vent holes for the first mold cavity 134 are not shown). The first mold 132 is then removed thereby forming the highly thermally conductive portion 156 (similar to element 112 of FIG. 1) of the heat dissipation device being fabricated, as shown in FIG. 4. Although the highly thermally conductive portion 156 is shown as being hemispherical, the first mold cavity 134 may be adapted to form the highly thermally conductive portion 156 to any suitable shape.

Figure 5:
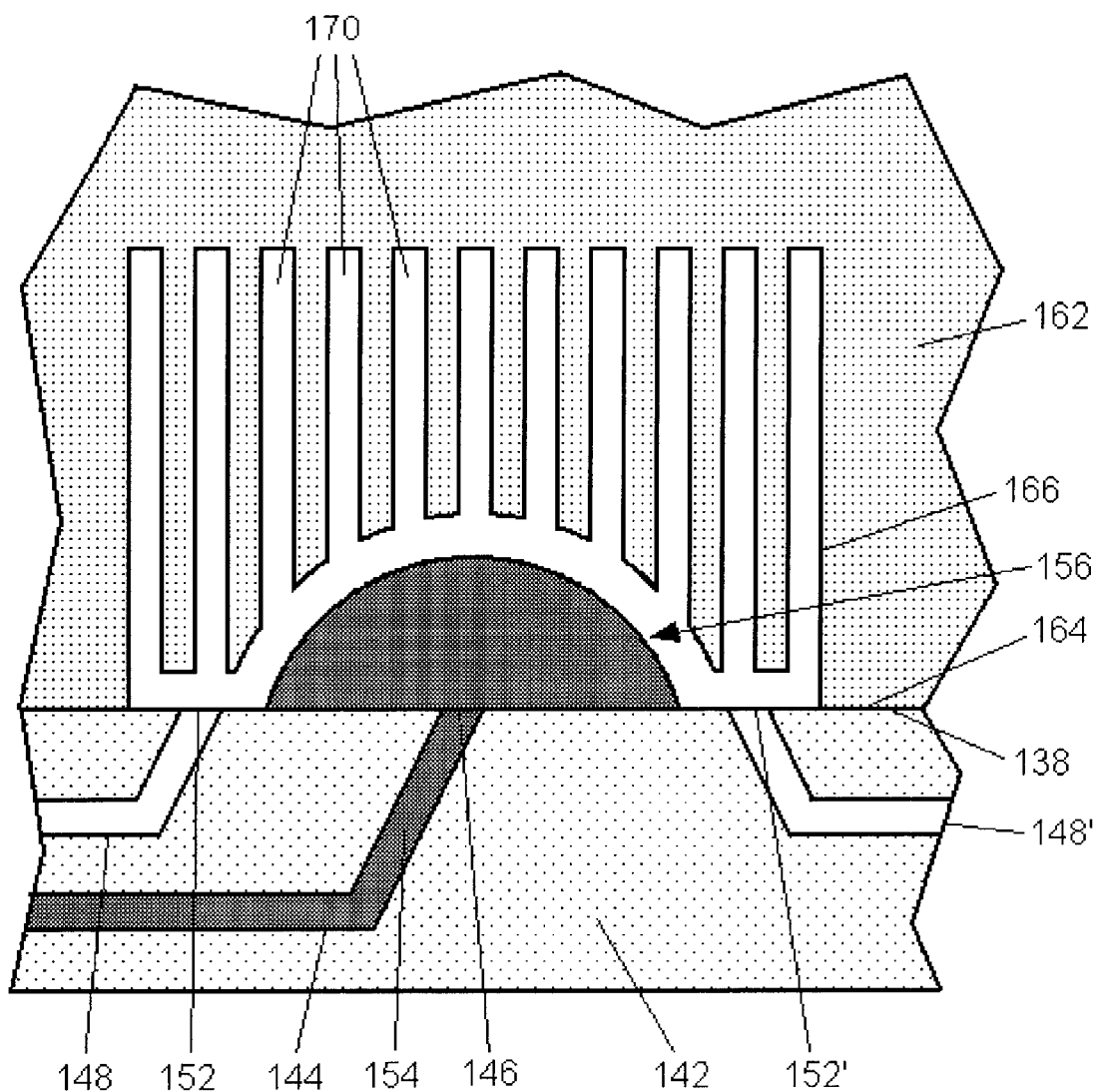
FIG. 5 is a side cross-sectional view of a second mold having a cavity defined therein abutted against the mold core as shown in FIG. 4, according to the present invention.

As shown in FIG. 5, a second mold 162 is placed on the mold core 142, wherein a contact surface 164 of the second mold 162 contacts the mold core contact surface 138. The second mold 162 includes a cavity 166, which is disposed to encompass the highly thermally conductive portion 156 and allows access thereto by at least one second gate opening (shown as the openings 152 and 152'). The second mold cavity 166 is preferably shaped with recesses 170 to form projections for the heat dissipation device being fabricated.

Figure 6:
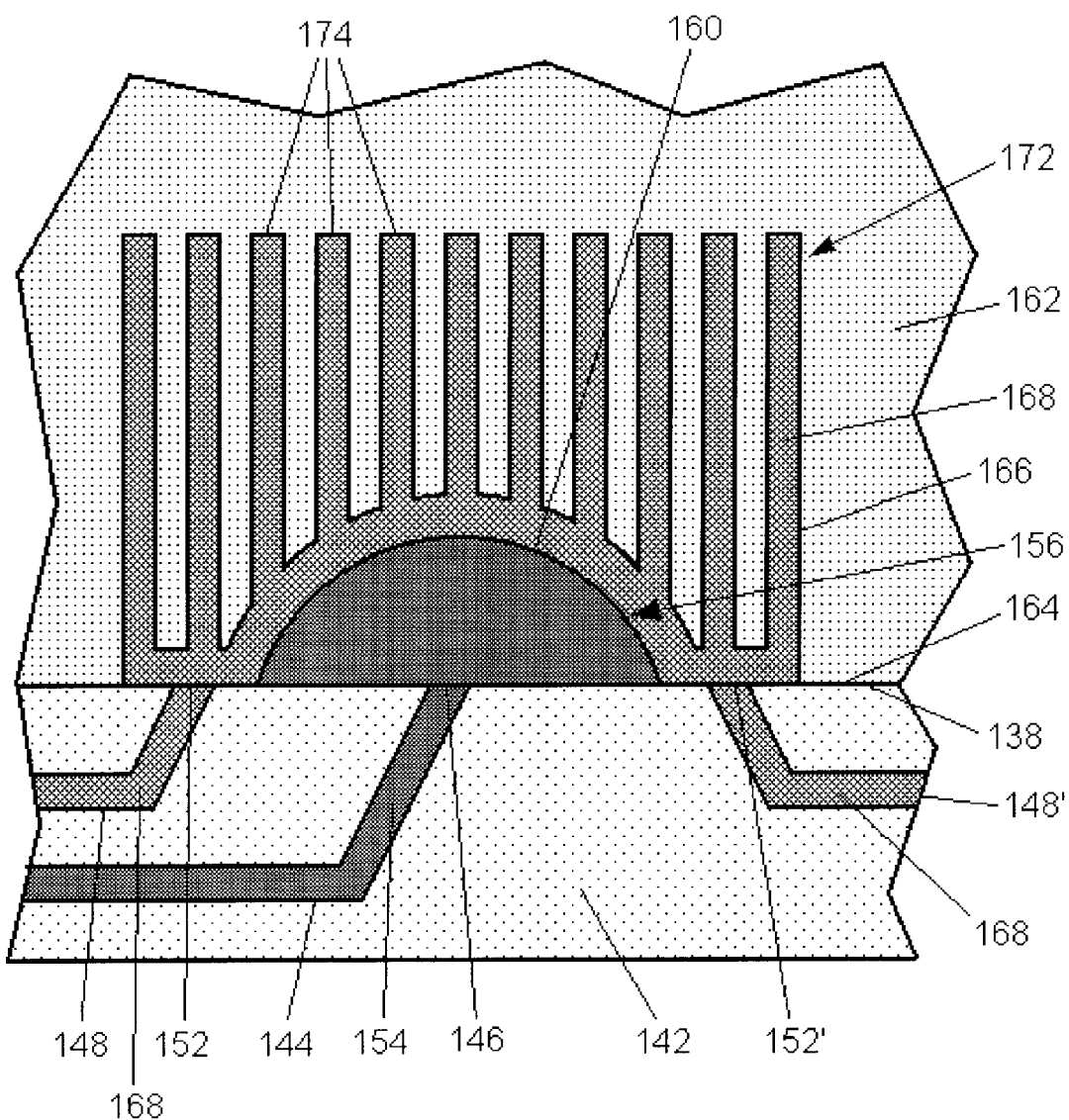
FIG. 6 is a side cross-sectional view of a second conductive material injected into the second mold cavity of FIG. 5, according to the present invention.
Figure 7:
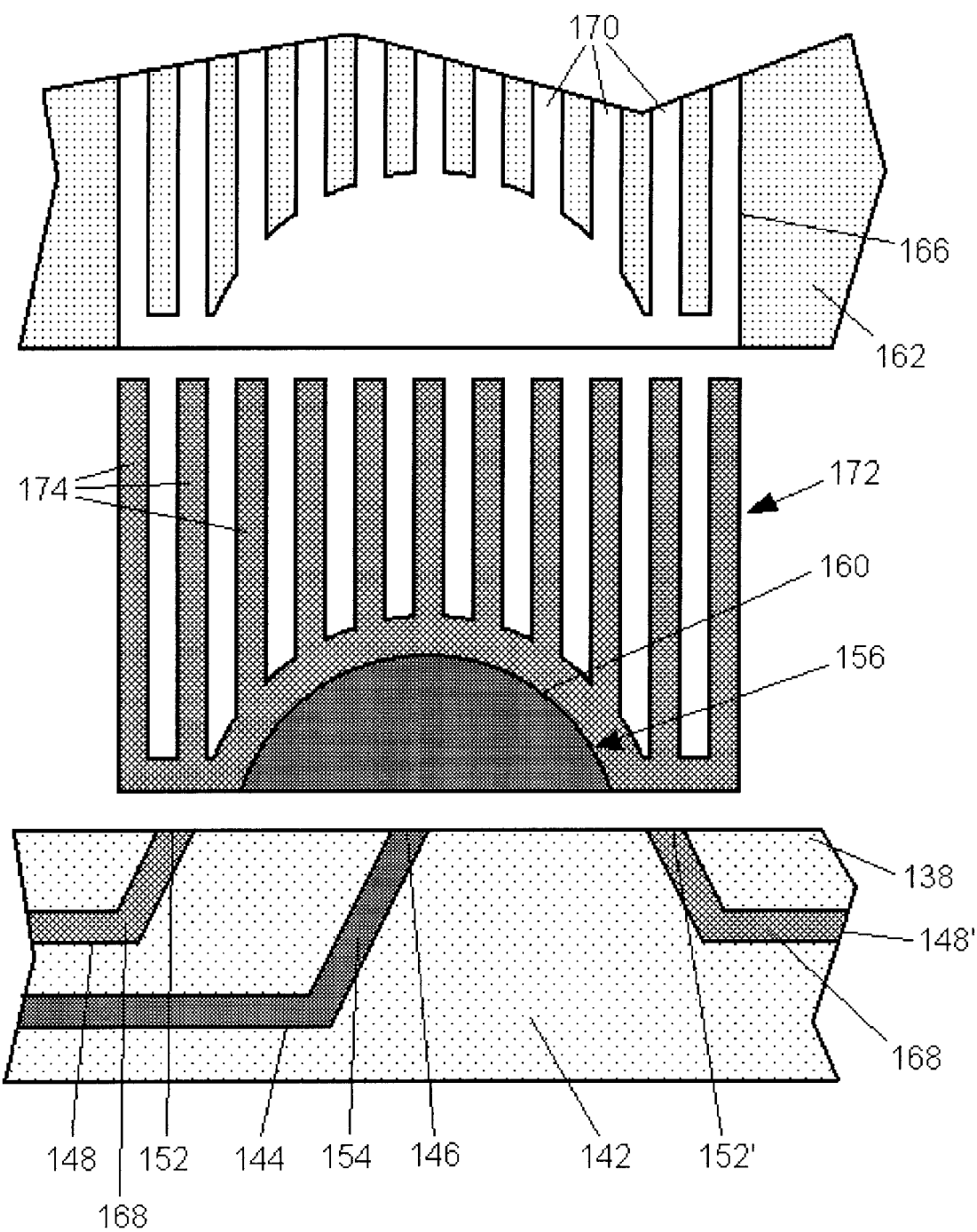
FIG. 7 is a side cross-sectional view of the second mold of FIG. 6 removed from the mold core, according to the present invention.

As shown in FIG. 6, a lightweight conductive material 168, preferably aluminum, is injected through the second gates 148 and 148' to fill the second mold cavity 166 (vent holes for the second mold cavity 166 are not shown) to abut the highly thermally conductive portion 156, which forms a molded interface 160 therebetween, and to form a second thermally conductive portion, shown as a finned portion 172 having a plurality of projections 174 (similar to elements 114 and 116 of FIG. 1). As shown in FIG. 7, the combination of the highly thermally conductive portion 156 and the finned portion 114 form a heat dissipation device 176. The heat dissipation device 176 is removed from the mold core 142 and second mold 162, and may then be further processed and/or thermally attached to any surface from which heat is desired to be dissipated.

The molded interface 160, between the highly thermally conductive portion 156 and the second conductive portion (shown as finned portion 172), formed by the molding procedure of the present invention substantially eliminates surface variations therebetween, which results in an efficient thermal interface.

The high thermal conductivity material 154 and the lightweight conductive material 168 may each be injected while in a molten state or, preferably, injected in a powdered or particulate form with a carrier or binder material, as known in the art. For example, fine metal particles, usually less than about 25 microns in average diameter, are hot mixed with a plastic or polymeric binder, such as polyvinyl alcohol, polypropylene, polyethylene, and with like, with a plasticizer, if necessary. The mixture is then cooled and granulated to form a feedstock. The feedstock is preferably between about 70 and 95% powdered metal by weight. The part is then molded, as discussed above. A majority of the binder material is removed from the part by baking the part in an oven at an elevated temperature, dissolving the binder with a chemical solvent, or removing the binder with a catalyst (by catalytic reaction). The part may then be sintered wherein the part is brought within a few degrees of its melting point. With the two metal configuration in the present invention, it would be within a few degrees for the metal having the lowest melting point. Sintering densifies the part, which may shrink the size of the part. Thus, the molds may have to be made to a size larger than the actual size of the finished part to compensate for the shrinkage.

Figure 8:
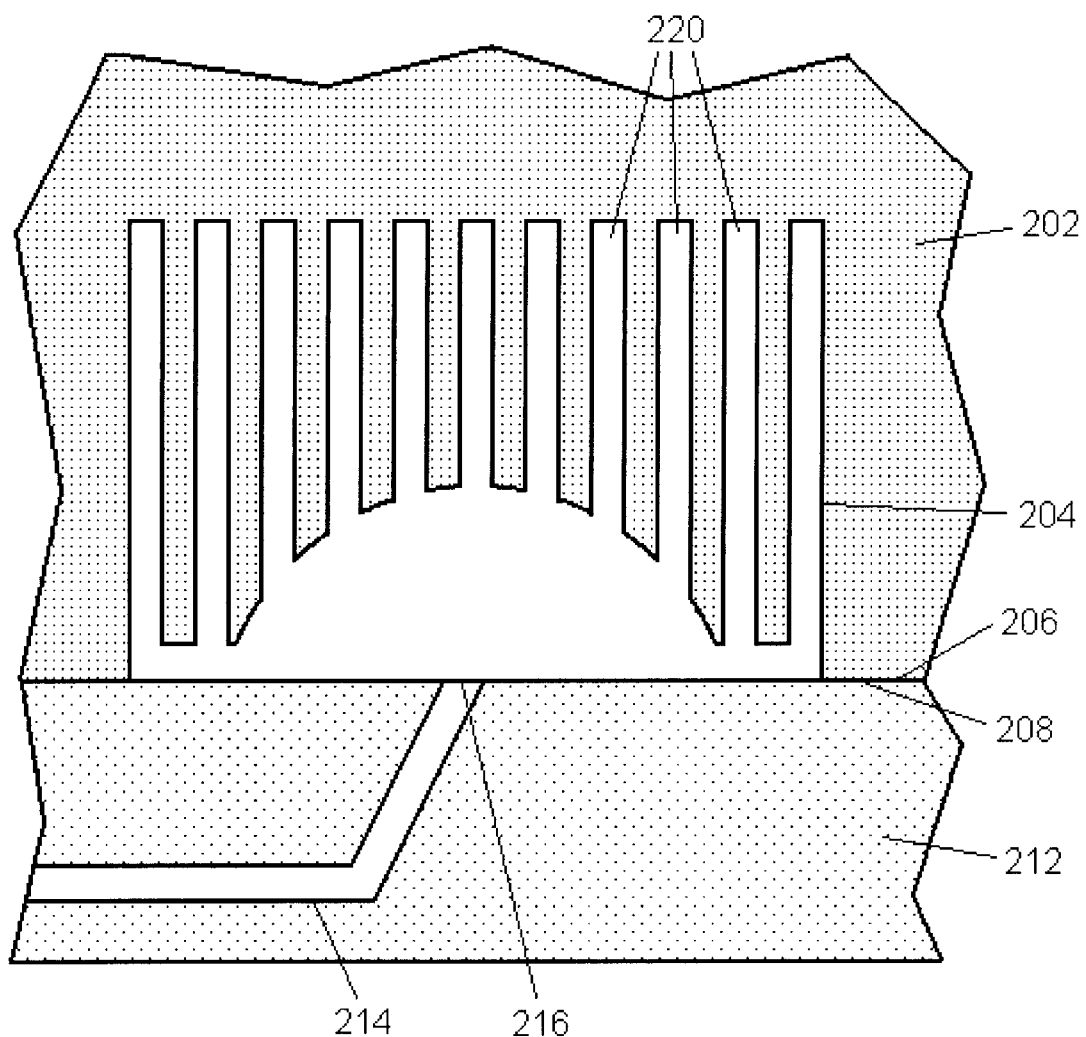
FIG. 8 is a side cross-sectional view of a mold core with a mold having a cavity defined therein abutted against the mold core, according to the present invention.

FIGS. 8–11 illustrate another embodiment of a method of fabricating a heat dissipation device. As shown in FIG. 8, a mold 202 having a contact surface 206 and a cavity 204 defined therein is provided. The mold contact surface 206 is placed against a contact surface 208 of a mold core 212. The mold core 212 has at least one first "channel" or "gate" 214 extending through the mold core 212, wherein the mold core gate 214 has at least one opening (shown as a single opening 216) at the mold core contact surface 218. The mold core opening 216 is positioned at the mold cavity 204 when the mold 202 and the mold core 212 are placed together. The mold cavity 204 is preferably shaped with recesses 220 to form projections for the heat dissipation device being fabricated.

Figure 9:
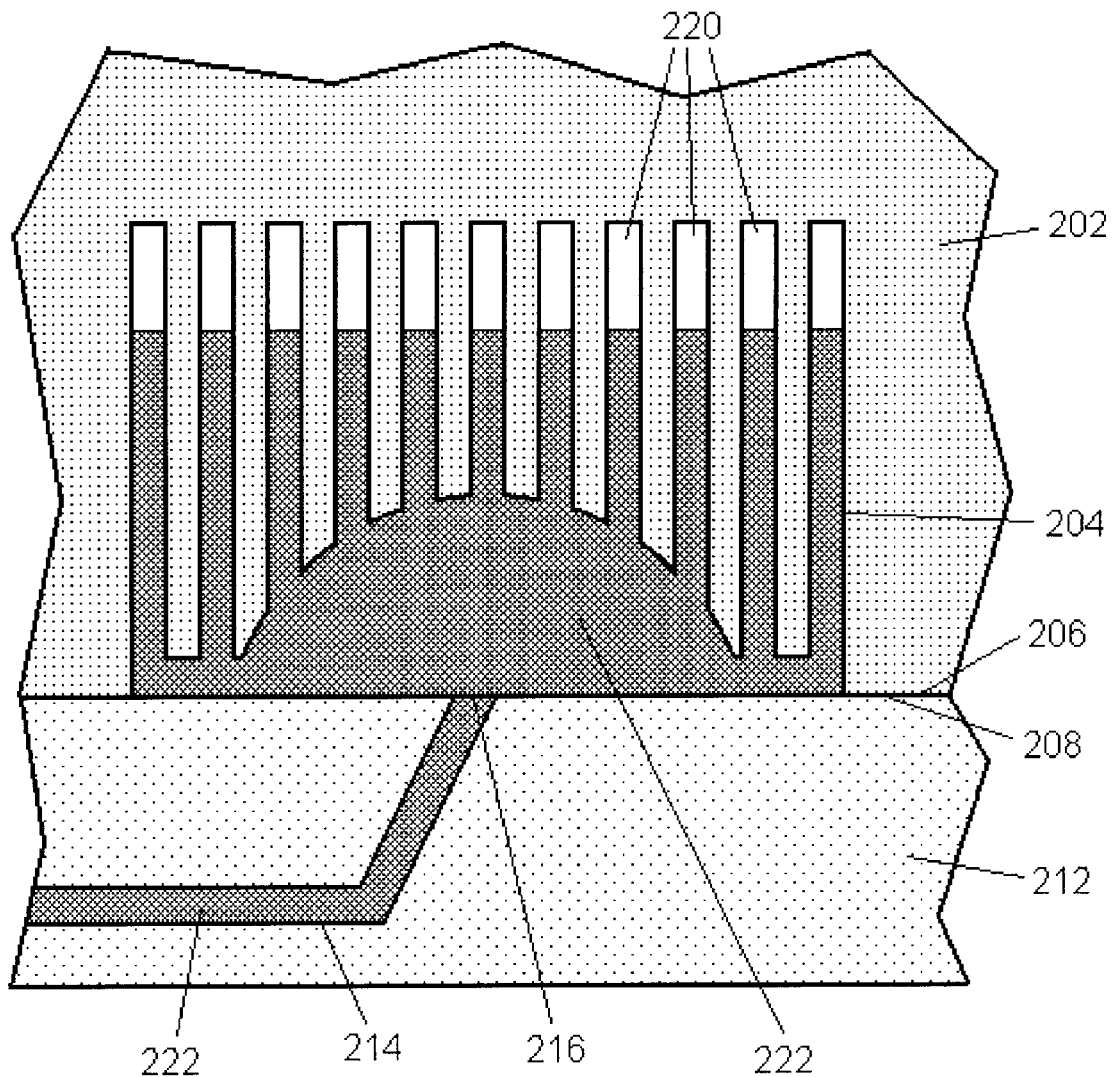
FIG. 9 is a side cross-sectional view of a first conductive material injected into and partially filling the mold cavity of FIG. 8, according to the present invention.
Figure 10:
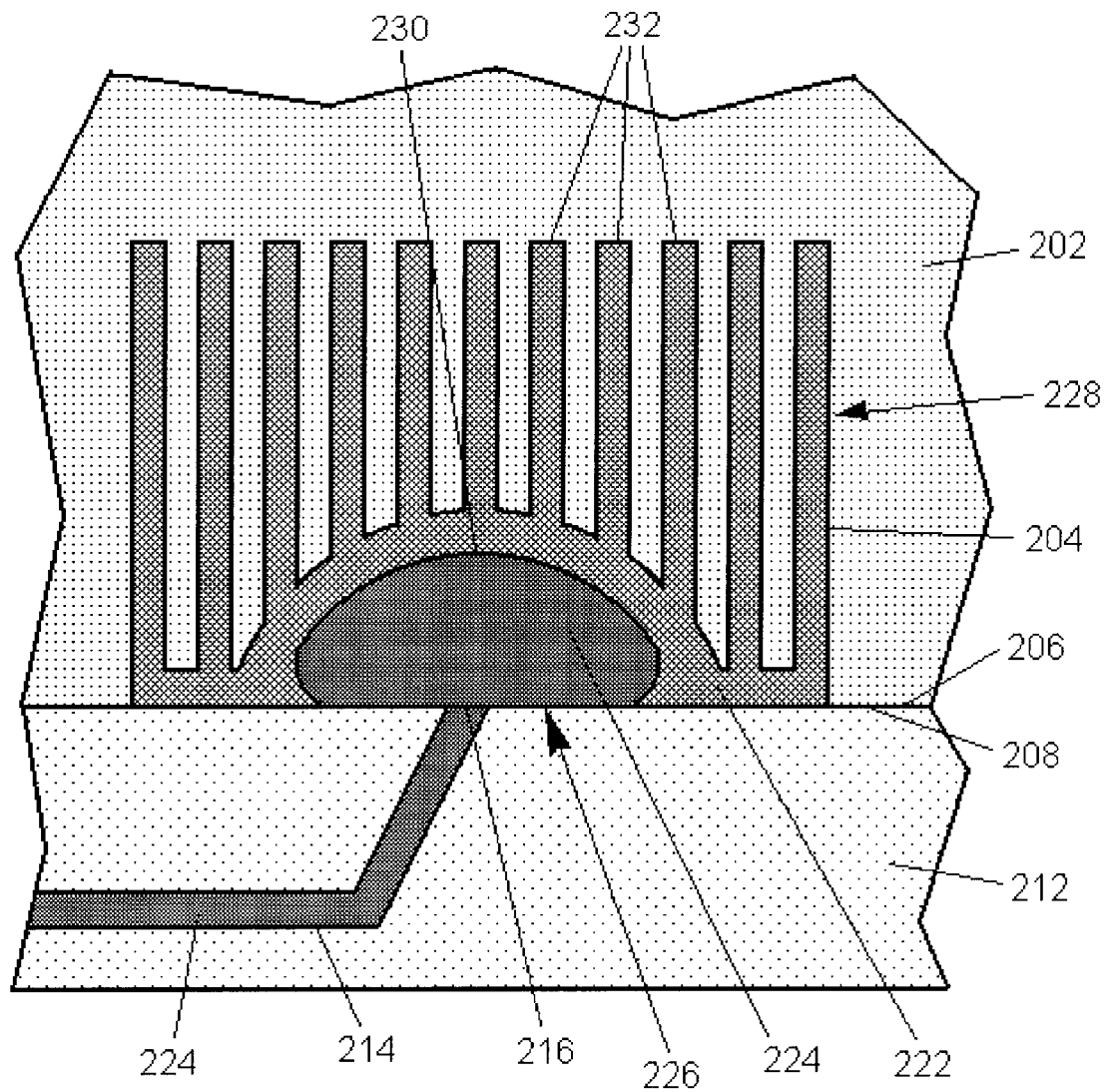
FIG. 10 is a side cross-sectional view of a second conductive material injected into the mold cavity of FIG. 9, according to the present invention.

As shown in FIG. 9, a lightweight conductive material 222, preferably aluminum, is injected through the mold core gate 214 to at least partially fill the mold cavity 204 (vent holes for the mold cavity 204 are not shown). As shown in FIG. 10, a high thermal conductivity material 224 is injected through the mold core gate 214 to form a highly thermally conductive portion 226 (similar to element 112 of FIG. 1), which forms a molded interface 230 therebetween. The injection of the high thermal conductivity material 224 also pushes the lightweight conductive material 222 to fill the mold cavity 204 and form a second thermally conductive portion (shown as finned portion 228 having a plurality of projections 232 (similar to elements 114 and 116 of FIG. 1)). It is, of course, understood that the mold core 212 could have multiple gates and that the lightweight conductive material 222 and the high thermal conductivity material 224 could be injected through different mold core gates.

Figure 11:
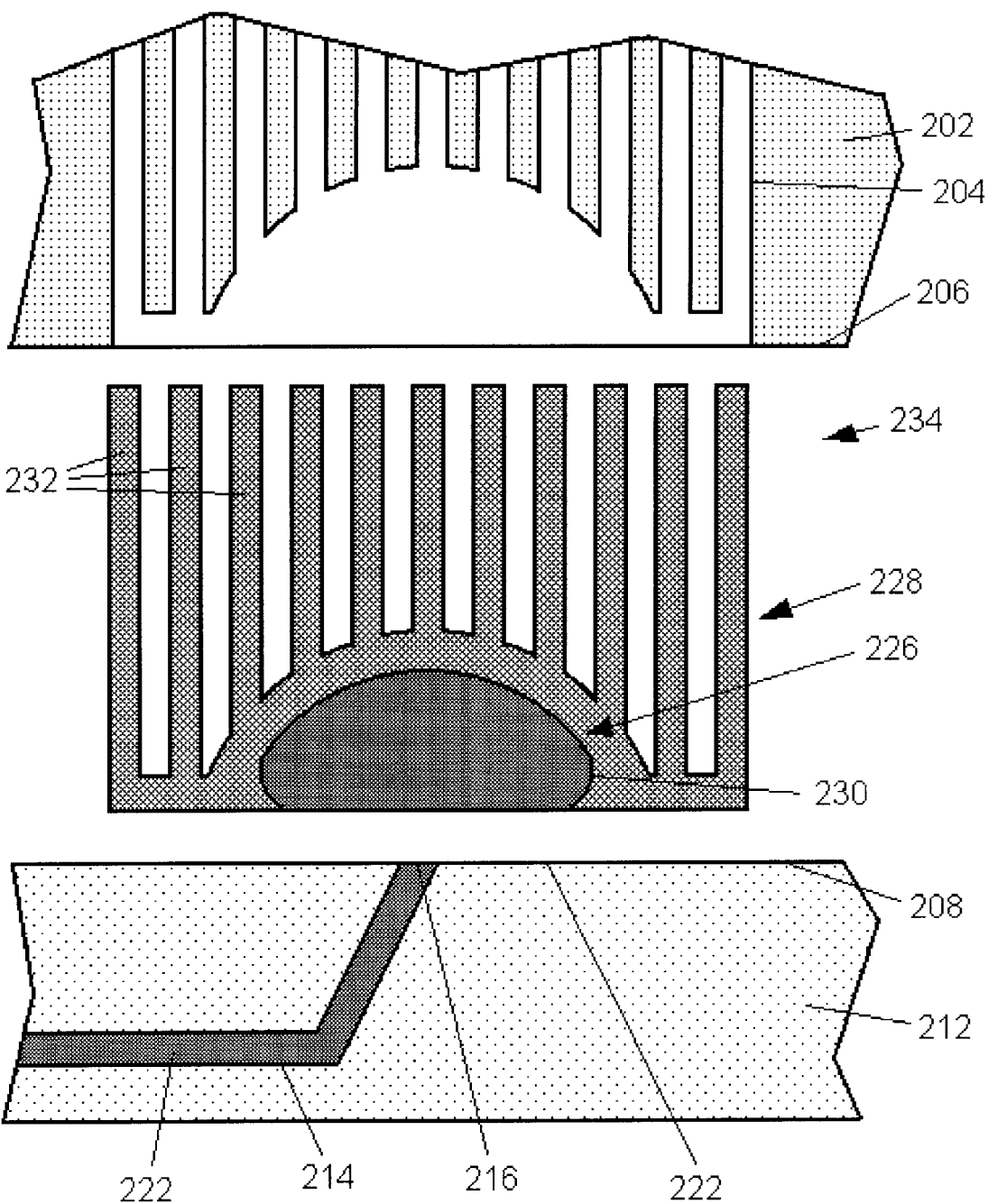
FIG. 11 is a side cross-sectional view of the second mold of FIG. 10 removed from the mold core, according to the present invention.
Figure 12:
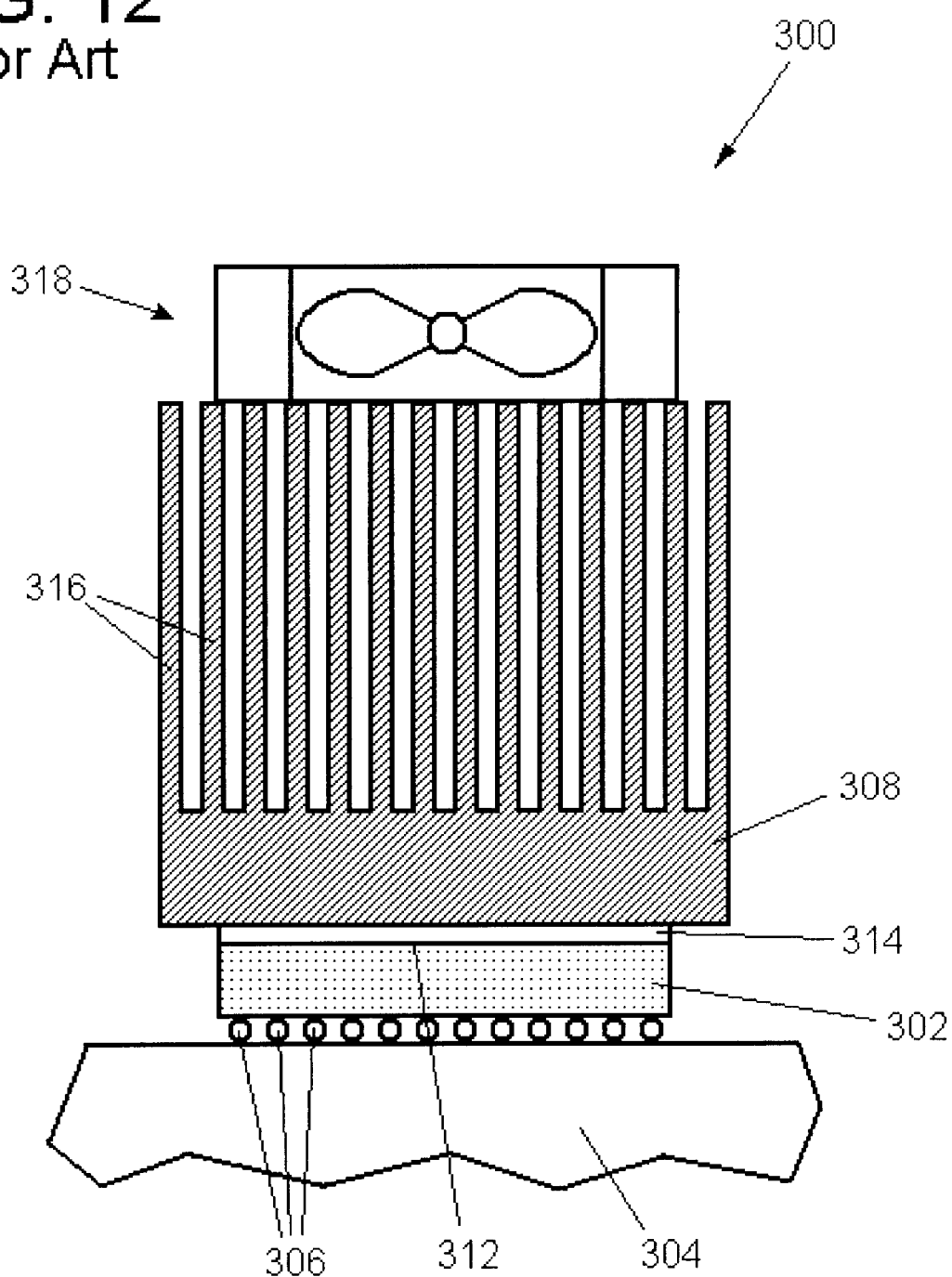
FIG. 12 is a side cross-sectional view of a heat dissipation device attached to a microelectronic die, as known in the art.
Figure 13:
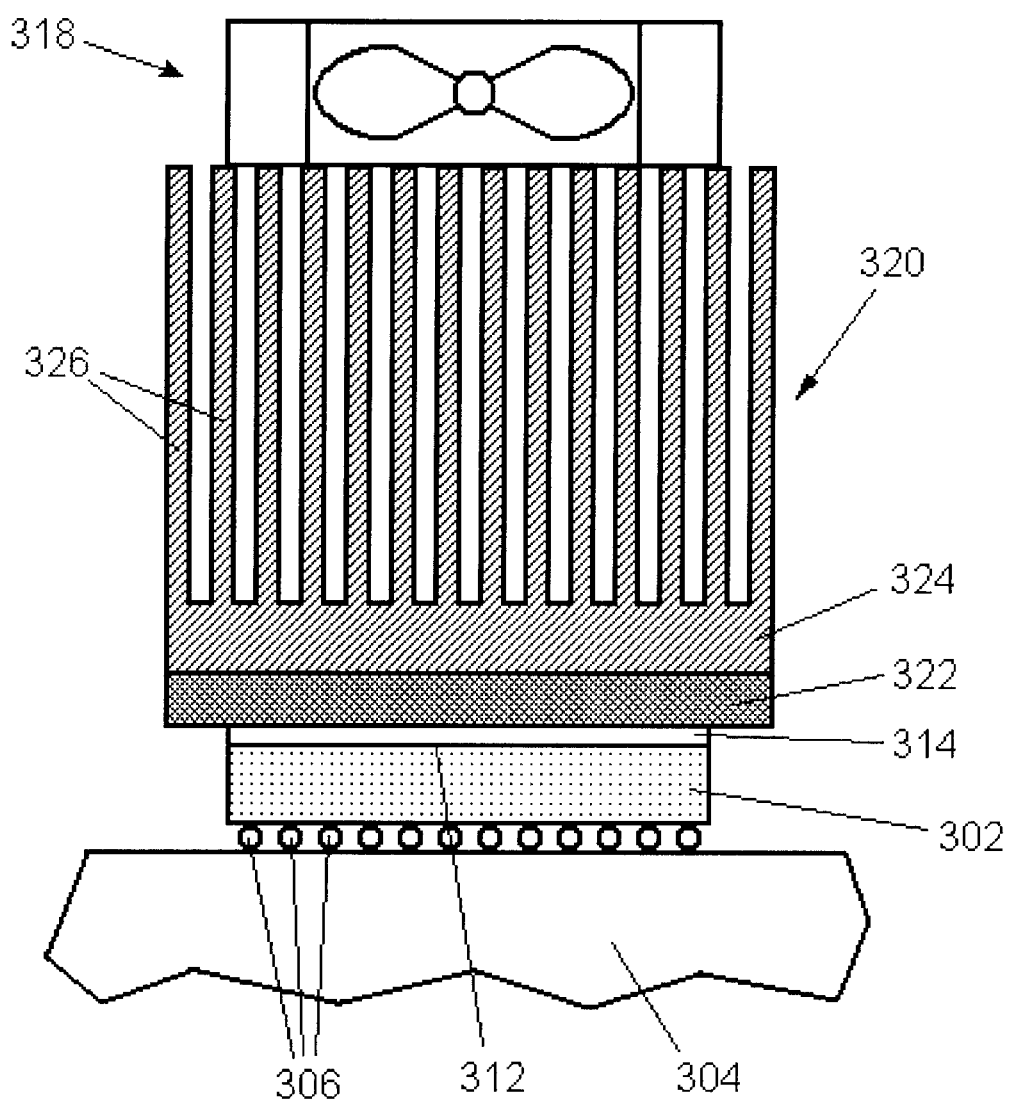
FIGS. 13 and 14 are side cross-sectional views of multiple material heat dissipation devices attached to microelectronic dice, as known in the art.
Figure 14:
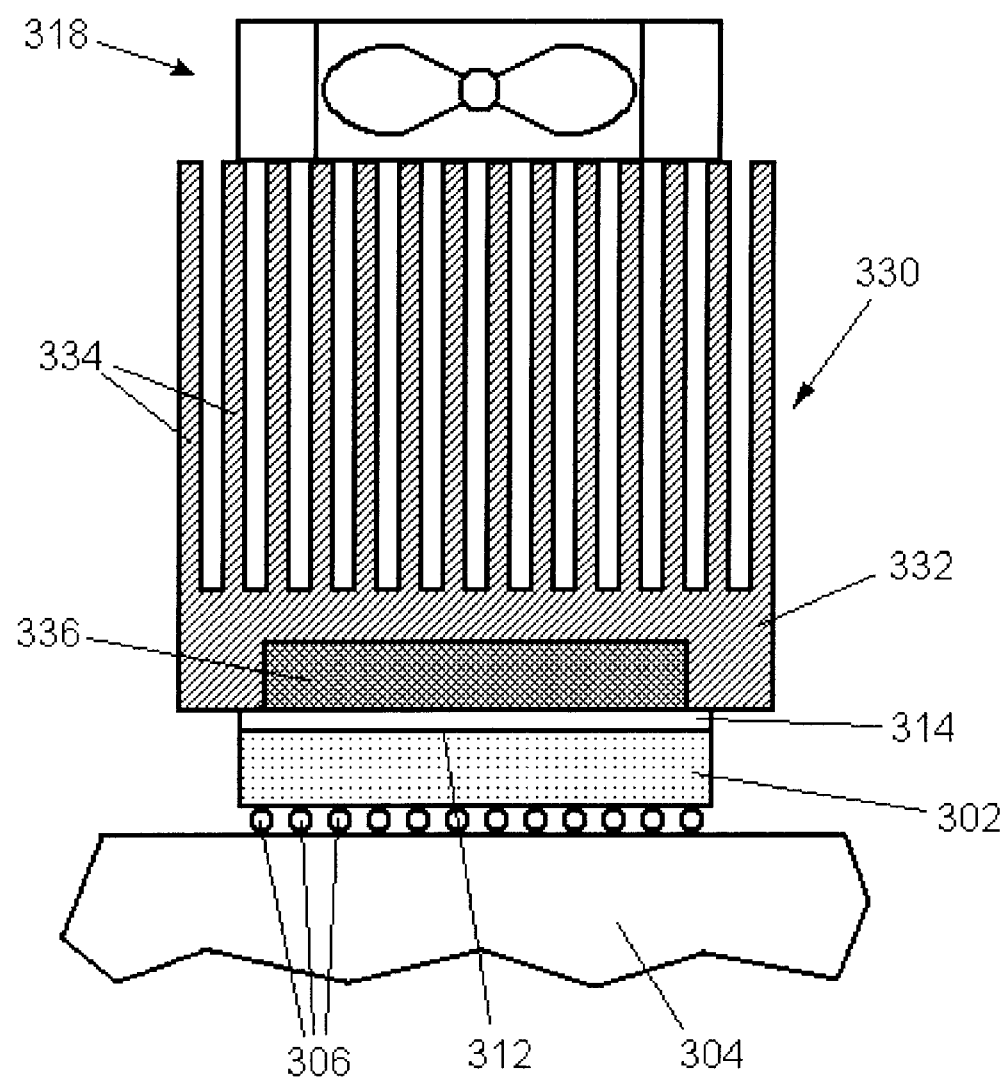

As shown in FIG. 11, the combination of the highly thermally conductive portion 226 and the finned portion 228 form a heat dissipation device 234. The heat dissipation device 234 is removed from the mold core 212 and mold 202, and may then be further processed and/or thermally attached to any surface from which heat is desired to be dissipated.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a heat dissipation device, comprising:
    providing a first mold having a cavity defined therein and having a contact surface;
    providing a mold core having a contact surface and at least one first gate extending therethrough, and at least one second gate extending therethrough, said mold core first gate and said mold core second gate each having at least one opening at said mold core contact surface;
    abutting said first mold contact surface against said mold core contact surface such that said at least one mold core first gate opening is position within said first mold cavity;
    injecting a high thermal conductivity material through said at least one mold core first gate to fill said first mold cavity to form a highly thermally conductive portion;
    removing said first mold;
    providing a second mold having a cavity defined therein and having a contact surface;
    abutting said second mold contact surface against said mold core contact surface such that at least one mold core second gate opening is positioned within said second mold cavity, and such that said second mold cavity encompasses at least a portion of said highly thermally conductive portion;
    injecting a thermal conductive material through said at least one mold core second gate into said second mold cavity to form a second conductive portion; and
    removing said highly thermally conductive portion and said second conductive portion from said second mold.

2. The method of claim 1, wherein injecting said high thermally conductivity material through said at least one mold core first gate comprises injecting a high thermal conductivity material comprising copper through said at least one mold core first gate.

3. The method of claim 2, wherein injecting said high thermally conductivity material through said at least one mold core first gate comprises injecting a high thermal conductivity material comprising copper and a carrier material through said at least one mold core first gate.

4. The method of claim 3, wherein injecting said high thermally conductivity material through said at least one mold core first gate comprises injecting a high thermal conductivity material comprising copper and a polymer carrier material through said at least one mold core first gate.

5. The method of claim 1, wherein injecting said thermal conductive material through said at least one mold core second gate comprises injecting a thermal conductive material comprising aluminum through said at least one mold core second gate.

6. The method of claim 5, wherein injecting said thermal conductive material through said at least one mold core second gate comprises injecting a thermal conductive material comprising aluminum and a carrier material through said at least one mold core second gate.

7. The method of claim 6, wherein injecting said thermal conductive material through said at least one mold core second gate comprises injecting a thermal conductivity material comprising aluminum and a polymer carrier material through said at least one mold core second gate.

8. The method of claim 1, wherein providing said second mold having a cavity defined therein comprises providing said second mold having a cavity defined with recesses to form a plurality of projections.

9. A method of fabricating a heat dissipation device, comprising: injection molding a first highly thermal portion, comprising
- providing a first mold having a cavity defined therein and having a contact surface;
- providing a mold core having a contact surface and at least one first gate extending therethrough, and at least one second gate extending therethrough, said mold core first gate and said mold core second gate each having at least one opening at said mold core contact surface;
- abutting said first mold contact surface against said mold core contact surface such that said at least one mold core first gate opening is position within said first mold cavity;
- injecting a high thermal conductivity material through said at least one mold core first gate to fill said first mold cavity to form a highly thermally conductive portion; and wherein injection molding a second thermally conductive portion comprises:
- removing said first mold;
- providing a second mold having a cavity defined therein and having a contact surface;
- abutting said second mold contact surface against said mold core contact surface such that at least one mold core second gate opening is positioned within said second mold cavity, and such that said second mold cavity encompasses said highly thermally conductive portion; and
- injection molding a second thermally conductive portion such that said second thermally conductive portion abuts said first highly thermally conductive portion, comprising injecting a thermal conductive material through said at least one mold core second gate into said second mold cavity to form a second conductive portion.

* * * * *